(12) United States Patent
Huebinger et al.

(10) Patent No.: US 7,651,942 B2
(45) Date of Patent: Jan. 26, 2010

(54) METAL INTERCONNECT STRUCTURE AND METHOD

(75) Inventors: Frank Huebinger, Poughkeepsie, NY (US); Michael Beck, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/203,883

(22) Filed: Aug. 15, 2005

(65) Prior Publication Data

US 2007/0037385 A1    Feb. 15, 2007

(51) Int. Cl.
H01L 21/4763    (2006.01)

(52) U.S. Cl. .................. 438/639; 438/638; 438/702; 257/E21.579; 257/E21.58

(58) Field of Classification Search .............. 438/697, 438/700, 702, 703, 709, 761, 776, FOR. 388, 438/FOR. 395, 622, 623, 626, 627, 631, 780, 438/618, 633, 637–639; 257/E21.575, E21.579, 257/E21.58
See application file for complete search history.

(56) References Cited

U.S. PATENT DOCUMENTS

| | | | | |
|---|---|---|---|---|
| 5,976,963 A * | 11/1999 | Cronin et al. | ............... | 438/597 |
| 6,042,999 A * | 3/2000 | Lin et al. | .................... | 430/316 |
| 6,297,149 B1 * | 10/2001 | Stamper | ..................... | 438/637 |
| 6,380,073 B1 * | 4/2002 | Hwang et al. | ............... | 438/637 |
| 6,812,133 B2 * | 11/2004 | Takeuchi | ..................... | 438/623 |
| 6,945,451 B1 * | 9/2005 | Bridges | ........................ | 232/19 |
| 6,958,540 B2 * | 10/2005 | Gambino et al. | ............ | 257/750 |
| 2001/0012684 A1 * | 8/2001 | Hattori et al. | ................ | 438/618 |
| 2001/0054769 A1 * | 12/2001 | Raaijmakers et al. | ....... | 257/758 |
| 2003/0157806 A1 * | 8/2003 | Nagahara et al. | ............ | 438/694 |
| 2004/0038518 A1 * | 2/2004 | Chung | ......................... | 438/631 |
| 2004/0175932 A1 * | 9/2004 | Kim et al. | .................... | 438/637 |
| 2005/0059232 A1 * | 3/2005 | Andreas | ..................... | 438/627 |
| 2009/0197404 A1 * | 8/2009 | Yang | .......................... | 438/652 |

* cited by examiner

*Primary Examiner*—Matthew Smith
*Assistant Examiner*—Quovaunda Jefferson
(74) *Attorney, Agent, or Firm*—Slater & Matsil, L.L.P.

(57) ABSTRACT

A method of fabricating a semiconductor device including a metal interconnect structure with a conductive region formed in a first dielectric layer, and an overlying, low-k, dielectric layer. A via and trench are formed in a dual damascene structure in the overlying dielectric layer, the via aligned with the conductive region and the trench. A sacrificial liner to release organic residues is deposited in the via and over the upper surface of the wafer, over which an organic planarization layer is deposited. The organic planarization layer is removed with a dry plasma etch, followed by a wet clean to remove the sacrificial liner. A diffusion barrier to separate the conductive material from the dielectric layers is deposited over the dual damascene structure and over the upper surface of the wafer. A conductive structure is formed over the diffusion barrier and polished to form an even surface for further processing steps.

36 Claims, 7 Drawing Sheets

METAL INTERCONNECT STRUCTURE AND METHOD

TECHNICAL FIELD

The present invention relates generally to semiconductor devices and methods, and more particularly to a metal interconnect structure and method.

BACKGROUND

Semiconductors are widely used for integrated circuits for electronic applications, including radios, televisions and personal computing devices, as examples. Such integrated circuits typically use multiple transistors fabricated in single-crystal silicon. It is common for millions of semiconductor devices to be included on a single semiconductor product. To provide the necessary signal and power interconnections for the multiplicity of semiconductor devices, many integrated circuits now include multiple levels of metallization.

The semiconductor industry continuously strives to decrease the size of the semiconductor devices located on integrated circuits. Miniaturization is generally needed to accommodate the increasing density of the circuits necessary for today's semiconductor products. The increasing density has lead to the need for more metallic layers, typically of aluminum and more recently of copper, to provide the circuit interconnections. For CMOS ICs with 250 nm feature size, four metallic layers for interconnections are generally sufficient. Below 100 nm, nine or more metallic layers will often be required. With the increasing number of metallic interconnection layers, more manufacturing steps and cost are required to form the interconnections than the transistors and diodes in the semiconductor device. For high complexity, high density chips with six or more layers of metallization, the total length of the layered interconnect wiring in the chip can be of the order of a mile. The signaling speed among on-chip devices provided by these interconnections has thus become a significant factor in chip performance. The resistance of the interconnecting wiring generally increases as a consequence of its width-height product being reduced faster than its length is shortened, which further aggravates the signaling-speed problem.

In the past, the material typically used to isolate conductive leads in these metallic layers from each other has been silicon dioxide. However, the dielectric constant (k) of silicon dioxide deposited by chemical vapor deposition is high, on the order of 4.1 to 4.2. The constant k is a proportionality constant for the capacitance between two electrical conductors and is based on a scale where 1.0 represents the dielectric constant of a vacuum. Silicon dioxide has been the preferred material for the interlayer dielectric in silicon products because it provides a minimal thermal expansion coefficient mismatch with conductive layer materials, and is a strong material, but its high dielectric constant is a significant factor in the delay associated with signal transmission through interconnecting wiring, affecting the response time or throughput of the semiconductor device. Using a dielectric material with low-k dielectric coefficient is thus important in semiconductor devices with reduced feature sizes.

Advanced CMOS processes, particularly CMOS processes producing fine-line structures smaller than 100 nm, employ low-k and ultra-low-k dielectric materials for the intermetallic and intra-metallic dielectric layers in order to reduce the capacitive coupling between interconnect lines and thereby reduce the signaling delays. But low-k dielectric materials can be difficult to use and without due care may not be as robust in manufacturing processes and in the end product as silicon dioxide. For example, widely used low-k materials generally comprise organic spin-on materials, which must be heated after application to remove the liquid or solvent. Low-k materials generally have a high thermal expansion coefficient compared to metals and silicon dioxide, and have a lower moisture and chemical resistance. These materials with low dielectric constant are not easily etched or cleaned, and are typically altered by dry-etching processes, causing them to at least partially lose their low-k properties. Porous dielectrics, often used for their low dielectric constant, are particularly prone to these effects, resulting in unreliable or low-performing products.

Figure 1:
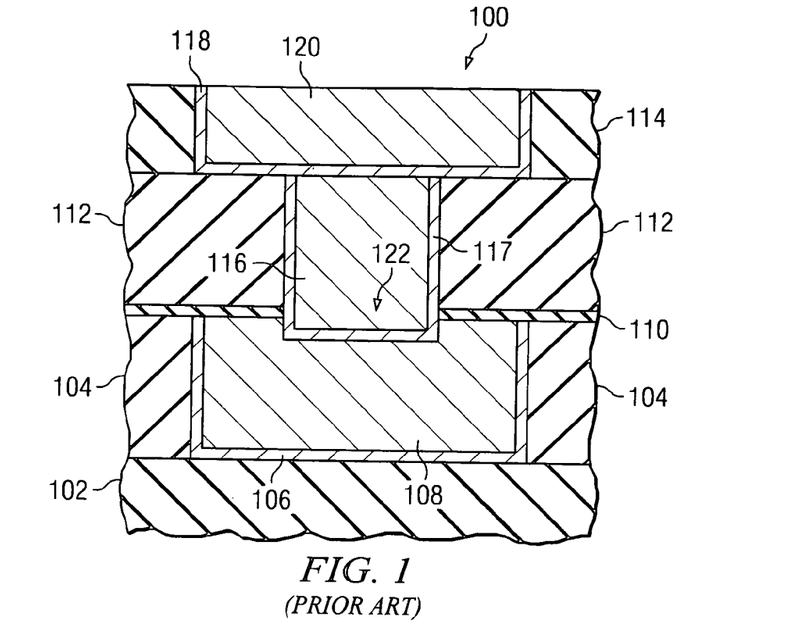
FIG. 1 illustrates a cross-sectional view of a prior art integrated circuit structure having vias connecting conductive lines of the various conductive layers in a single damascene approach.
Figure 2:
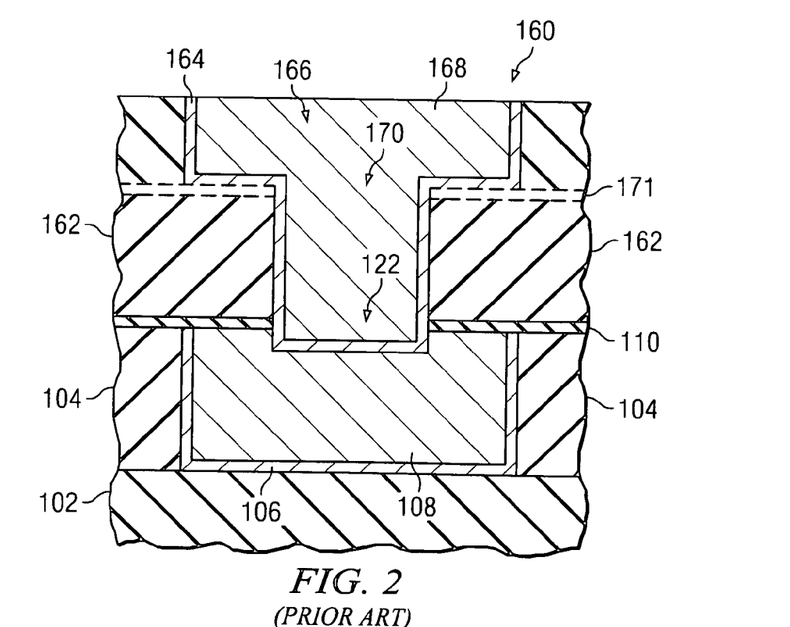
FIG. 2 illustrates a cross-sectional view of a prior art integrated circuit structure having vias connecting conductive lines of the various conductive layers in a dual damascene approach.

FIGS. 1 and 2 show prior art structures (layers of dies on wafers) 100 and 160 for prior methods of fabricating multi-layer interconnects of an integrated circuit on a semiconductor wafer. FIG. 1 shows a single damascene approach, and FIG. 2 shows a dual damascene approach.

Referring first to the structure 100 shown in FIG. 1, a substrate 102 is provided, typically comprising silicon dioxide deposited over single-crystal silicon. The substrate 102 may include other conductive layers or other semiconductor elements, e.g., transistors, diodes, etc. Compound semiconductors such as GaAs, InP, Si/Ge, SiC are often used in place of silicon.

A first dielectric layer 104 is deposited over the substrate 102. In the prior art structure described herein, dielectric 104 comprises a low-dielectric constant material, having a dielectric constant k of 3.6 or less, for example. Low-k dielectric material 104 comprises an organic spin-on material such as a polyimide or others. Trademarks for such materials include Dow Chemical Company's SiLK™ and AlliedSignal, Inc.'s Flare™ for example. After depositing a low-k dielectric 104 typically by CVD (chemical-vapor deposition), the wafer 100 is exposed in a heating step (e.g., baked) to remove the solvents and cure the dielectric material. Temperatures of the heating step may reach 400 degrees C., for example. Other low-k dielectrics can be deposited by chemical vapor deposition.

Dielectric material 104 is patterned and etched, and conductive lines 108 are formed. An optional conductive liner 106 (which is necessary as a barrier for copper) may be deposited prior to formation of conductive lines 108. Conductive liner 106 typically comprises Ta, TaN, WN, TiN, etc., and conductive lines 108 may comprise conductive materials such as aluminum, copper, tungsten, other metals, or combinations thereof, for example.

A dielectric cap layer 110 comprising SiN, for example, is deposited over conductive lines 108 and low-k dielectric 104. A second layer of dielectric material 112 is deposited over conductive lines 108. Second dielectric layer 112 comprises a low-k material and thus must be baked at up to 400° C. to remove solvents. Dielectric layer 112 is patterned, e.g., with a mask, and via openings are formed using an etch process step, preferably an anisotropic etch process which is substantially directed towards the perpendicular surface of the wafer. A small portion of the tops of conductive lines 108 is typically etched during the anisotropic etch process, as shown by the recess at 122.

A metallic liner 117 must be deposited over the via hole and the metal line trench. The via openings are filled with a metallic material, preferably the same as the material used for the conductive lines 108, for example, to form vias 116. Vias 116 are typically substantially cylindrical, and may have a slightly greater diameter at the tops than at the bottoms due to the via opening etch process not being entirely perpendicular to the wafer 100 surface.

A third dielectric layer 114 comprising a low-k dielectric material, for example, is deposited over vias 116, heated to remove the solvents, patterned, and etched. Conductive lines 120 are formed over vias 116 to provide a connection to conductive lines 108 in the underlying first dielectric layer 104. An optional conductive liner 118 may be deposited prior to the formation of conductive lines 120. Conductive lines 120 preferably comprise a metal material the same as conductive lines 108, for example. Many other conductive layers may be deposited in this manner. It is currently not uncommon to have six or more conductive layers within a semiconductor structure as the complexity of devices continues to increase. Layers and structures in this and following figures with reference designations the same as previously described layers and structures and will not be redescribed in the interest of brevity.

FIG. 2 shows generally at 160 a prior art dual-damascene approach of forming multi-layer interconnects of an integrated circuit. A substrate 102 is provided, and a first dielectric layer 104 is deposited over the substrate 102. Dielectric material 104 may comprise a low-k dielectric. Dielectric material 104 is patterned and etched, and conductive lines 108 are formed. An optional conductive liner 106 may be deposited prior to formation of conductive lines 108.

A dielectric cap layer 110 is deposited over conductive lines 108 and low-k dielectric 104. A second layer of dielectric material 162 is deposited over conductive lines 108. In a dual damascene approach, second dielectric layer 162 is thicker than in a single damascene approach, because both via 170 and metal line 168 are formed within the second dielectric layer 162. Alternatively, an etch stop material 171 may be deposited near the interface of the via 170 and metal line 168, as shown in phantom.

Dielectric layer 162 is patterned and etched, generally in two separate steps to form via holes 170 and trenches 166 for metal lines 168. The via hole 170 may be formed first, followed by the formation of 166 trench, or vice versa. A metallic liner 164 must be deposited over the via hole and the metal line trench. The via openings and metal line trench are filled with a metallic material, preferably the same as the material used for the conductive lines 108, for example, to form vias 170 and metal lines 168.

Thus, in prior art processes, copper (or other metal) conductors to interconnect devices are formed in (BEOL) back-end-of-line processes using single or dual-damascene techniques, and preferably using a dielectric with a low dielectric constant. Lithography followed by dry-etch steps create vias and trenches in the dielectric layer. In production processes, vias and trenches are often produced using via-first methods wherein a first lithographic process creates a via pattern to etch down to a metallic layer below a dielectric layer, and a second lithographic process creates a trench pattern co-aligned with the via. Via-first methods employ an (OPL) organic planarizing layer to fill the vias and provide a level surface for the following trench lithography. After the trench is patterned, exposed, and etched, the organic planarizing material must be completely removed to prevent interference with the following processes. But after exposure of the organic material to several plasma and chemical processing steps, organic residues are often left behind that are not completely removed by the usual ashing, steps such as an oxygen-based reactive ion etch. Even wet cleans compatible with BEOL processes do not completely remove the organic residues. Solvents compatible with BEOL processes do not effectively reach into depressions with small feature sizes, do not dissolve the cross-linked OPL material, or chemically alter the metal lines or the low-k interlayer dielectric. In addition, a low-k interlayer dielectric (ILD) can be underetched by plasma and wet-etch processing.

A principal limitation of prior-art processes is the difficulty of reliably forming metallic interconnects with high-speed signal transmission characteristics and high reliability, particularly for devices with structures smaller than 100 nm and typically with gate counts exceeding one million gates. A need exists for an improved process and method that can overcome these deficiencies by producing vias coupled to trenches in a dielectric layer in a BEOL process without leaving behind an organic residue which may cause a critical reliability issue due to via degradation. In addition, a need exists to preserve the structure of ILDs in plasma and wet-etching processes that can attack such materials in later processing steps.

SUMMARY OF THE INVENTION

These and other problems are generally solved or circumvented, and technical advantages are generally achieved, by preferred embodiments of the present invention which provide a metal interconnect structure and method. In accordance with a preferred embodiment, a method of fabricating a semiconductor device including a metal interconnect structure includes providing a wafer that comprises a conductive metallic region in a first dielectric layer. The method includes forming a second dielectric layer over the conductive region and the first dielectric layer. Preferably, the second dielectric layer comprises a low-k dielectric material. The low-k dielectric material preferably comprises SiCOH, but can comprise other interlayer dielectric materials. In a further embodiment, the low-k dielectric material preferably comprises a porous low-k dielectric material.

In a preferred embodiment, the method includes forming a via hole in the second dielectric layer, and aligning the via hole to overlie the conductive region. The method preferably includes forming a hard mask layer over the second dielectric layer before forming the via hole. In a preferred embodiment, the hard mask layer comprises silicon nitride.

In a preferred embodiment, the method includes using a dual-damascene approach to form an interconnect structure. The method includes forming a trench in the second dielectric layer that overlies the via hole.

In a preferred embodiment, the method includes forming a sacrificial liner over the wafer, the sacrificial liner being formed along sidewalls and the bottom of the via hole and over the upper surface of the wafer. The method further includes forming a planarization layer over the wafer and in the via hole and forming a dual damascene structure within the organic planarization layer and the second dielectric layer. Preferably, the planarization layer is an organic planarization layer. The dual damascene structure includes the via hole. The method further includes removing the planarization layer with a dry plasma etch and performing a wet clean to remove the sacrificial liner. The method preferably includes forming a second liner as a diffusion barrier for metal over the wafer, the second liner being formed along sidewalls and the bottom of the dual damascene structure and over the upper surface of the wafer. In a preferred embodiment, the second liner comprises tantalum nitride. The method further includes depositing a conductive material over the second liner, wherein the conductive material is separated from the first dielectric layer and the second dielectric layer by the second liner. In a preferred embodiment, the conductive material in the conductive region comprises copper. In a further embodiment, the conductive material in the conductive region comprises tungsten, but other metals or combinations of metals can be used. In a preferred embodiment, the sacrificial liner comprises silicon dioxide. In a preferred embodiment, the fluid used in the wet clean comprises dilute hydrofluoric acid.

In yet a further embodiment, a cap layer is formed between the first dielectric layer and the second dielectric layer. In a preferred embodiment, the cap layer comprises a SiCN material.

In a preferred embodiment, the method includes depositing a conductive material in the second liner. In a further preferred embodiment, the method includes depositing a copper seed layer over the liner and electrodepositing copper over the copper seed layer. In a further embodiment, the method includes electroplating copper onto the second liner. Preferably, the method includes chemical-mechanical polishing the top surface of the wafer to form a substantially planar surface.

Embodiments of the invention are useful since they are especially tailored for use with semiconductor devices with feature sizes of 100 nm and smaller, and with low-k dielectrics, which can be used to shorten the capacitive delay in the chip-level interconnect arrangement. Semiconductor devices with feature sizes of 100 nm and smaller require upwards of six layers of metallization for interconnects with structures comparable in size to the features formed on the underlying silicon substrate. The integrity of these metallized structures directly affects the functionality and yield of the end device if they are not accurately and cleanly formed. Embodiments of the invention also advantageously reduce underetch and damage of low-k ILDs by plasma or wet etches, especially below a hard mask layer. Embodiments of the invention also enable easy removal of hardened polymer at the wafer edge or the wafer bevel, regions that are often heavily affected with polymer residues in dual-damascene integration schemes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

One embodiment of the invention for fabricating an interconnect structure is illustrated in FIGS. 3-12 and will be described with respect to preferred embodiments in a specific context, namely a dual-damascene metallization scheme for an interconnection arrangement. As will be explained below, and as would be understood by one of ordinary skill in the art, various modifications of the specific structure and process are possible. For example, although a dual-damascene metallization scheme is described using a via-first approach, other interconnection arrangements are contemplated within the scope of the invention such as single-damascene schemes and trench-first approaches.

Figure 3:
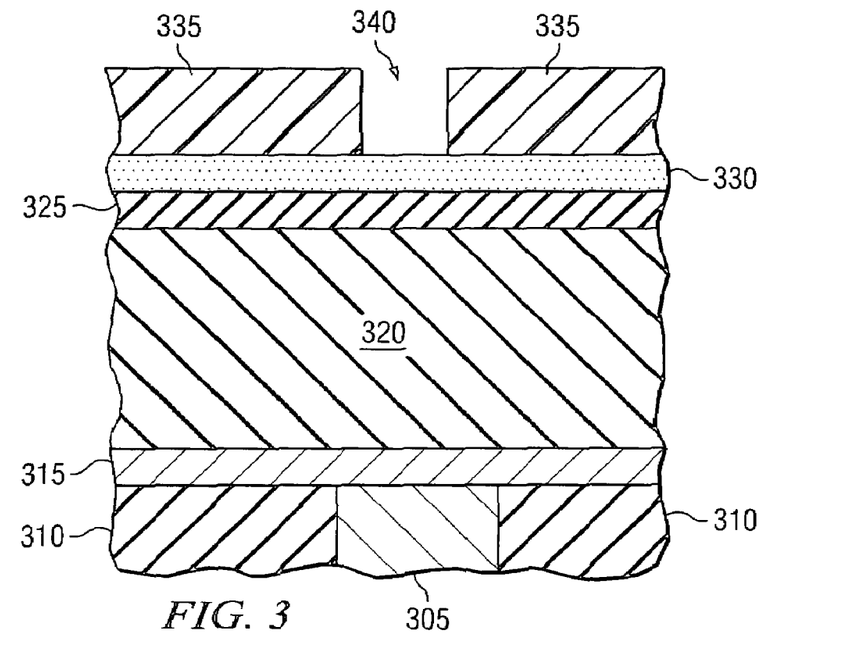
FIGS. 3-12 illustrate cross-sectional views of an integrated circuit structure of an embodiment of the invention during various stages of fabrication.

Turning now to FIG. 3, illustrated is a cross-sectional view of layers deposited during BEOL processing to form an interconnect structure to electrically interconnect devices on a semiconductor die. While not illustrated in the figure, the semiconductor die typically includes a number of active circuit components formed in the semiconductor body. The semiconductor body can be a bulk substrate (e.g., monocrystalline silicon) or a semiconductor-over-insulator (SOI) layer, as just two examples. The active circuit components preferably comprise transistors. Other components such as diodes, resistors and capacitors can also be formed. The interconnect structure of the present invention can be provided for a number of metallization levels. For example, an integrated circuit can have six or more metal layers, each of which is formed by the process described herein.

FIG. 3 shows a metal (such as copper or other metal) trace 305 deposited in a previous BEOL processing step in a trench formed in dielectric layer 310. In a preferred embodiment, the metal trace is copper. In other embodiments, the metal trace 305 can be a different material such as tungsten, aluminum, or gold and may be embedded in two separate layers. In the typical case, the metal trace 305 is part of a metal layer that was formed as one of a number of metallization levels in an integrated circuit. As an example, the metal trace 305 can be in the first metal layer over the active components (often referred to as metal 1). In other examples, the metal layer can be an upper metal layer (e.g., metal 2 or metal 5, as arbitrary examples). The dielectric layer 310 in which the metal trace 305 is formed is preferably a low-k or ultra-low-k dielectric.

A cap layer 315 is optionally deposited over the metal trace 305 in the dielectric layer 310 to provide a diffusion barrier for the metal such as copper into the inter-layer dielectric (ILD) 320 deposited thereabove. Cap layer 315 can also, or alternatively, serve as a barrier for some porous low-k materials to prevent moisture from migrating into the dielectric 310 or into the dielectric layer 320 deposited thereabove. For some embodiments that do not require this function, the cap layer 315 can be omitted. The cap layer 315 can include one or more of a nitride layer (e.g., $Si_3N_4$), an oxynitride layer (e.g., SiON), an oxide layer (e.g., $SiO_2$), a dense oxide layer, or other material. In a preferred embodiment, the cap layer 315 is formed from a SiCN material, which has a low dielectric constant. In an alternative embodiment, a metal cap layer (not shown) can be formed over the conductor 305 (but not over dielectric layer 310).

An ILD, 320, preferably formed with a low-dielectric-constant material to reduce coupling of signals between metallic layers and traces, is deposited above the cap layer 315, followed optionally by a hard mask layer 325 such as silicon dioxide or silicon nitride. The ILD 320 can have a thickness of between about 250 nm and about 700 nm, for example 500 nm. The hard mask layer will be removed later in a further processing step. The dielectric layer 320 can comprise any dielectric material such as an oxide (e.g., $SiO_2$) or a doped oxide (e.g., PSG, BPSG, FSG, or BSG). In the preferred embodiment, dielectric layer 320 comprises a low-k dielectric. In this context, a low-k dielectric, which can be either porous or non-porous, is a dielectric that has a dielectric constant less than the dielectric constant of undoped silicon dioxide. The low-k dielectric material can be an organic spin-on material such as a polyimide or others. Examples of porous low-k dielectric include JSR LKD-5109™ available from JSR Corporation and Flare™ available from Allied Signal, Inc. In the preferred embodiment, the dielectric layer 320 is formed by CVD (chemical vapor deposition) from SiCOH, either dense SiCOH or porous SiCOH (pSiCOH).

An (ARC) anti-reflection coating 330 is deposited over the hard mask layer 325 to provide a well conditioned optical base for a photoresist layer 335 that is spun onto the wafer with dehydrating and priming as necessary. The wafer is then baked, and the photoresist layer is selectively exposed and developed. The aperture 340 formed thereby in the photoresist layer enables etching through the anti-reflection coating 330 and the hard mask layer 325 in a later processing step to form a via in the ILD 320. The aperture 340 and the resulting via may be any size to accommodate the design but is typically at the design minimum. For example, the process and structure taught herein is particularly useful at small dimensions of less than 100 nm (e.g., 90 nm, 65 nm, 45 nm or below). The aperture may be formed in any of a number of shapes as viewed from a plan view (not shown) but is typically circular or elliptical.

Figure 4:
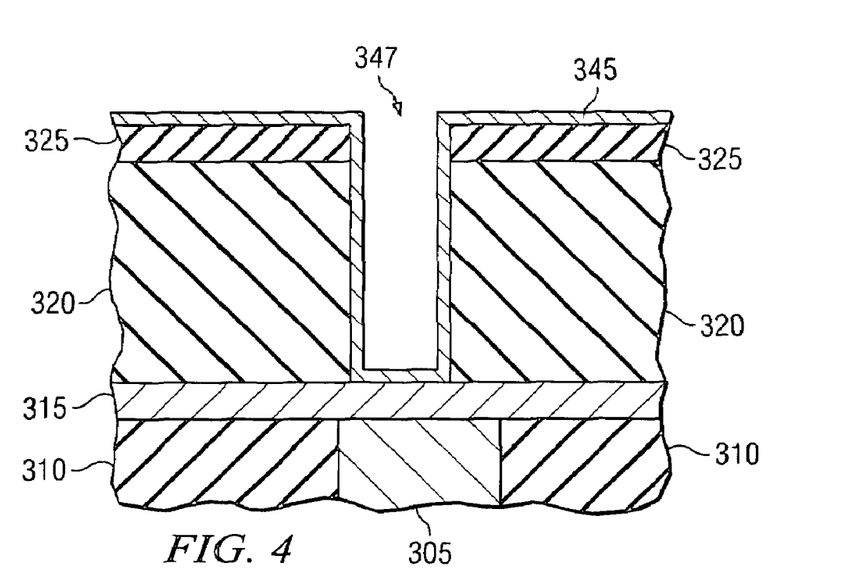

Turning next to FIG. 4, illustrated are layers of a semiconductor wafer deposited in further BEOL processing steps to form a via 347. The wafer is dry etched to the cap layer 315 using a plasma etch down to the cap layer. An oxide plasma processing step removes the photoresist layer 335 and the ARC layer 330 illustrated in FIG. 3. As illustrated in FIG. 4, a sacrificial liner 345 is deposited over the upper exposed surfaces of the wafer including the via 347. Preferably, the sacrificial liner 345 is a liner of silicon dioxide, 3 to 10 nm thick, preferably 5 nm thick, that is formed by CVD (e.g., by heating the wafer to a temperature such as 350 degrees C. in a gaseous mixture of silane and oxygen, which is a commonly used process to deposit a silicon dioxide layer). In a later processing step, the silicon dioxide sacrificial liner will be removed.

Figure 5:
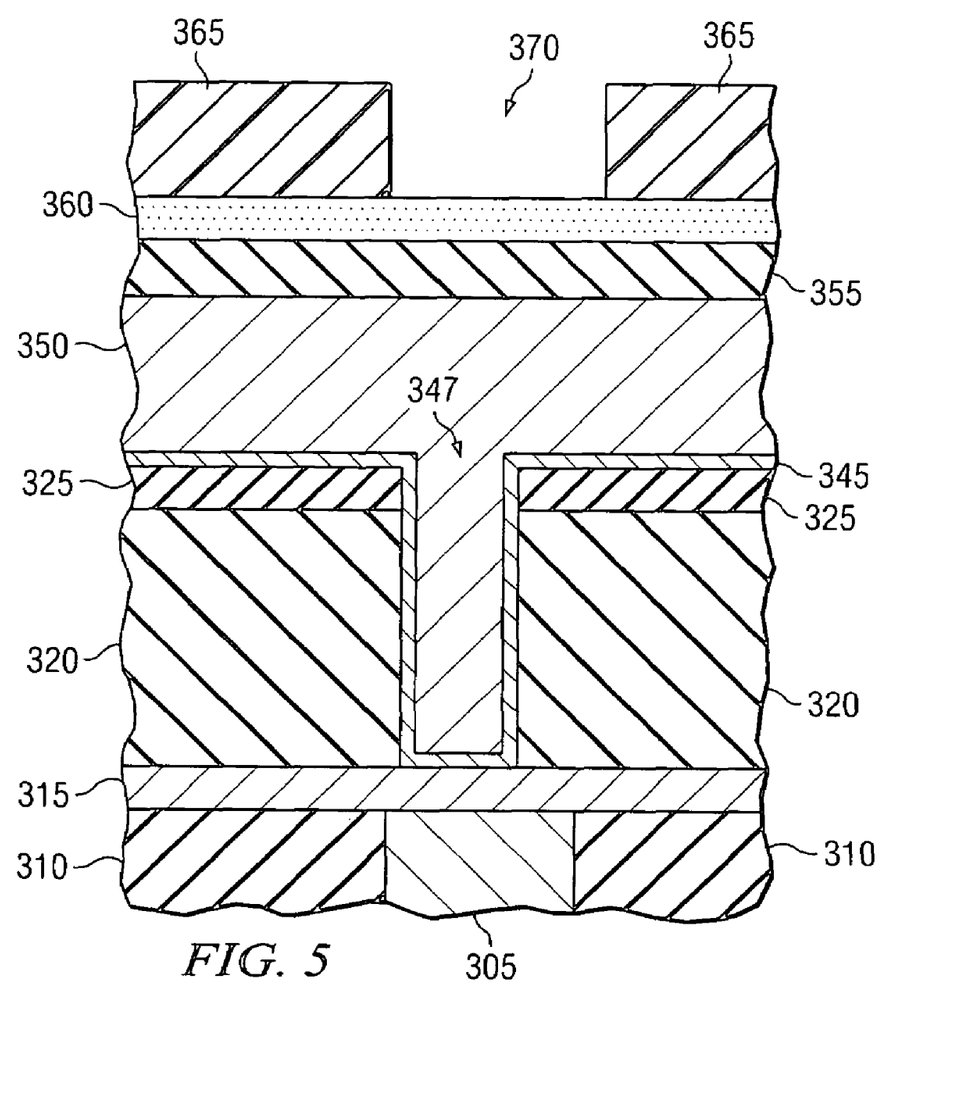

Illustrated in FIG. 5 is a cross-sectional view of a semiconductor wafer after lithography to prepare for deposition of the next metallic layer. An (OPL) organic planarization layer 350, typically a carbon-containing polymer such as NFC, is spun onto the wafer. The OPL fills the via 347 and provides a planarized surface for further processing steps applied thereabove. A hard mask layer 355 is deposited above the OPL to prevent chemical interaction and species diffusion between OPL layer 350 and the ARC layer 360 and the photoresist layer 365 that is deposited above the hard mask layer and baked. When included, the hard mask layer 355 can be deposited to a thickness preferably of 60 nm or more. After baking, selective exposure, and development of the photoresist layer 365, a trench 370 lying out of the plane of the figure is thereby formed in the photoresist aligned with the via 347 in the ILD 320.

Figure 6:
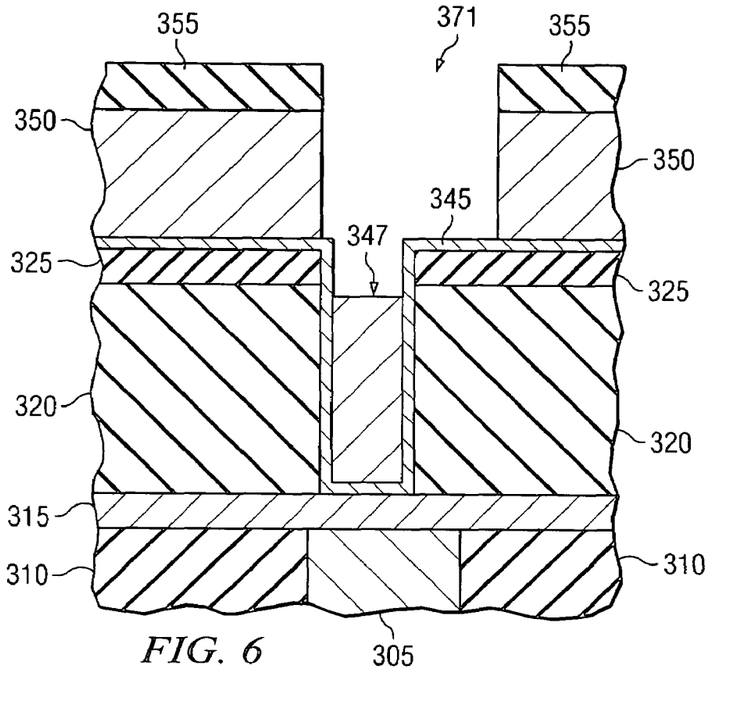

As illustrated in FIG. 6, the trench 371 through the OPL 350 and the sacrificial liner 345 is opened by continued etching down to and partially through the via 347. A three-step dry etch (RIE) reactive-ion etch is preferably used to form an aperture through the ARC (360, that is illustrated in FIG. 5), through the hard mask layer 355, and then through the OPL 350, partially etching through the OPL in the via 347. Different chemical etches are commonly used to sequentially remove these different materials as is well understood in the art. FIG. 6 should be recognized as an idealized drawing wherein some lateral etching of the OPL and other layers under the hard mask layer invariably occurs and is not illustrated in the figure. The trench 371 is one of a number of trenches that may be formed in a pattern of metal interconnects. The interconnect pattern is determined by the circuit design and the necessary interconnections. The via hole 347 is one of number of via holes that will provide a connection between the conductor to be formed in trench 371 with the conductors of underlying structures (e.g., metal trace 305).

Figure 7:
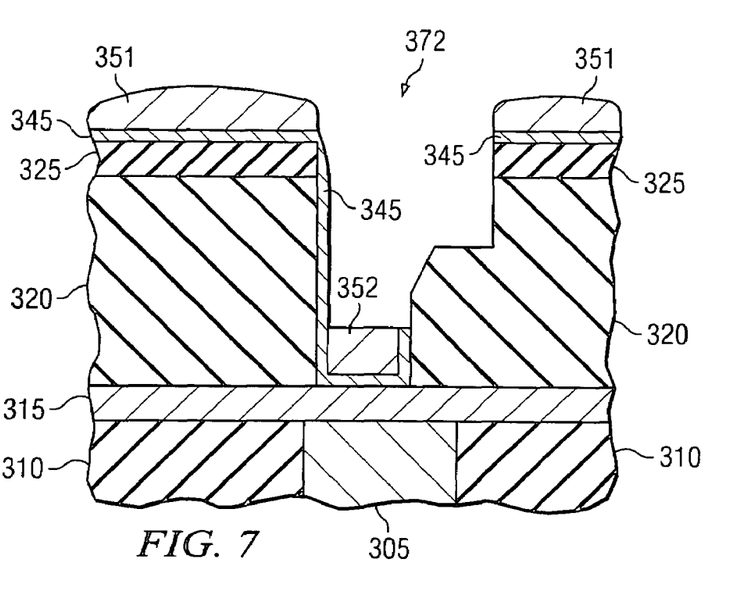

FIG. 7 illustrates the semiconductor wafer after continuation of the dry etching process preferably using an RIE operating on the OPL 351, showing further formation of the trench 372. A portion of the ILD 320, the overlying hard mask layer 325, and a portion of the overlying sacrificial liner 345 in the OPL are removed by the dry-etching process. Remaining portions of the OPL 351 and 352 above the sacrificial liner 345 and in the via after the etching process are illustrated in the figure.

Figure 8A:
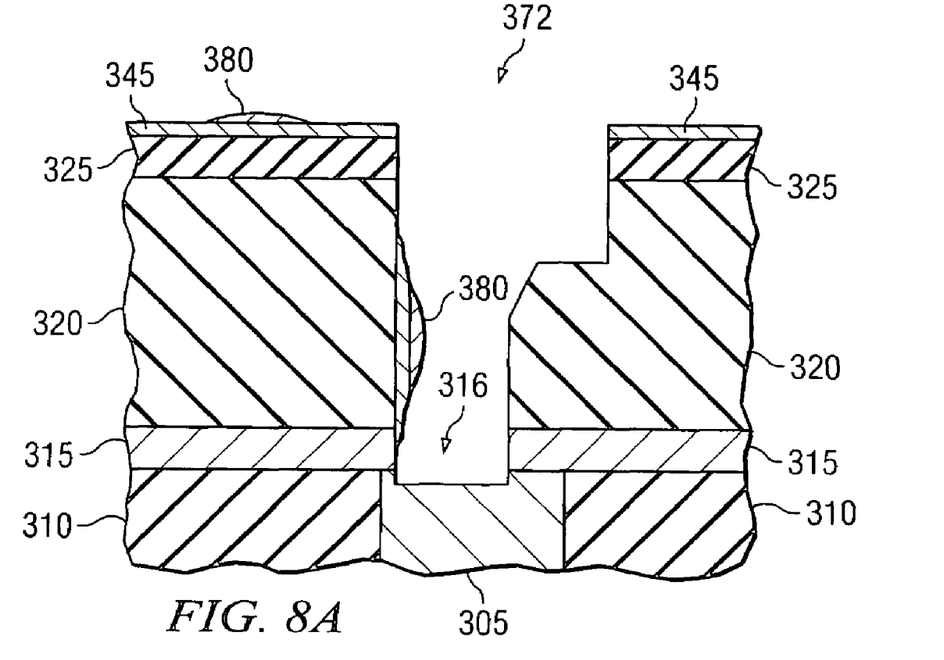
Figure 8B:
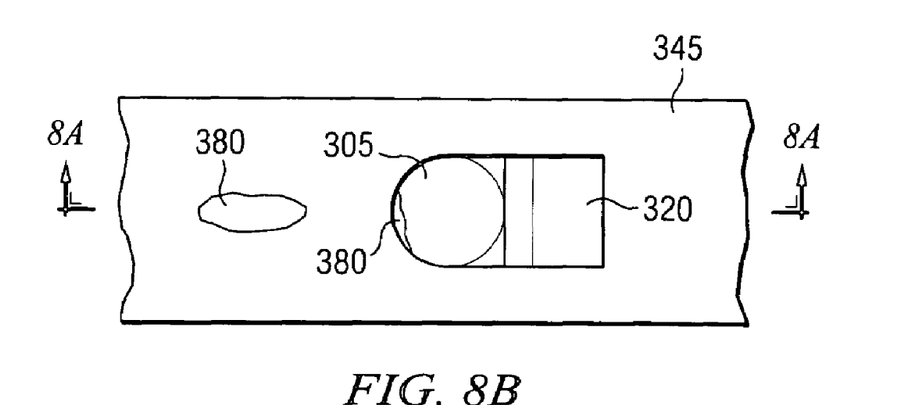

FIGS. 8A and 8B, collectively referred to as FIG. 8, illustrate cross-sectional and planar views, respectively, of the semiconductor wafer after removal of the OPL 351, and further formation of an aperture 316 in the cap layer 315 by RIE. The aperture in the cap layer provides a window for direct metallic contact between the via and the metallic trace 305. The OPL, which has been exposed to and chemically altered by several processing steps, now has a modified chemical composition, causing it to leave firmly attached and hardened polymer residues that are difficult to remove from the wafer with an oxide plasma (within the OPL removal step). The OPL is particularly difficult to remove from via sidewalls, which may be partially shielded by their vertical geometry from a cleaning process such as a reactive-ion etching process.

After the aperture in the cap layer 315 is formed, oxide-containing plasmas and oxidizing washes can no longer be used in processing steps without degrading desirable device properties, such as electrical conductivity of exposed metallic traces such as the trace 305 formed with copper. It is desirable, however, to remove all carbon-containing materials before performing further trace- or via-forming steps to preserve the functional integrity of the wafer and to accommodate further processing steps without compromising manufacturing yield. FIG. 8 illustrates remaining OPL or polymer residues 380 in the cross-sectional and planar views of the die. The remaining OPL and polymer residues will be removed with an aqueous wash that is performed next, advantageously using chemical susceptibility of the sacrificial liner to a DHF wash.

Figure 9:
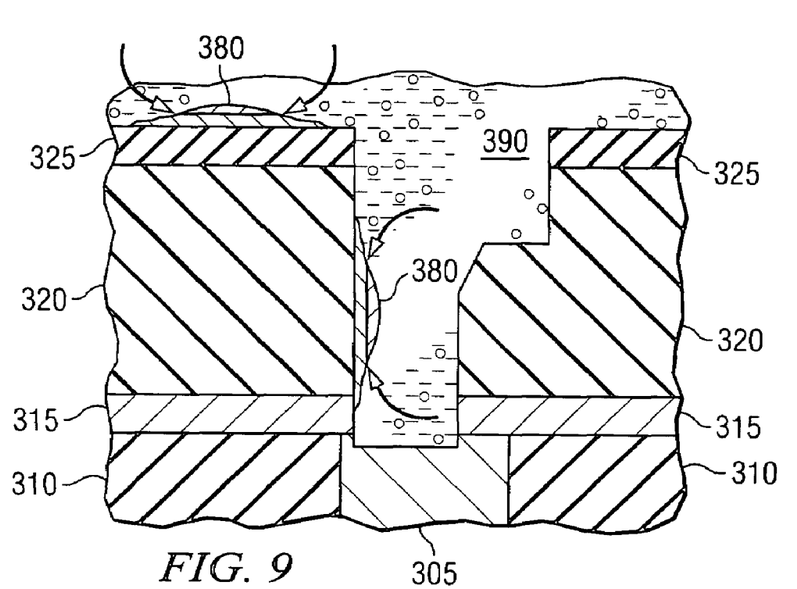

FIG. 9 illustrates a cross-sectional view of the semiconductor wafer during cleaning. In FIG. 9 the wafer is cleaned with a DHF (dilute hydrofluoric-acid) wash reacting with and dissolving the sacrificial liner, thereby releasing the remaining OPL and polymer residues. The DHF wash is preferably performed for a time of about 20 to about 60 seconds at a temperature of about 60° C. with a concentration of 1:300. The heavy curved arrows in the figure represent the chemical reaction of the DHF on the new sacrificial liner below the residues, which attacks the sacrificial liner and allows the OPL particles above the sacrificial liner to be easily washed away. The DHF wash does not substantially attack or alter the exposed metal trace 305 or the ILD 320. The DHF wash is entirely removed by a drying operation at a high wafer rotational speed, as is well understood in the art. During the DHF wash, polymer is also removed at the wafer edge, bevel, and partially from the wafer backside, as far as the sacrificial liner is deposited.

It is contemplated within the broad scope of the invention that other sacrificial liner and wash chemistry combinations can be used to permit removal of the OPL and the other polymer (or other) residues that are deposited above a sacrificial liner.

Figure 10:
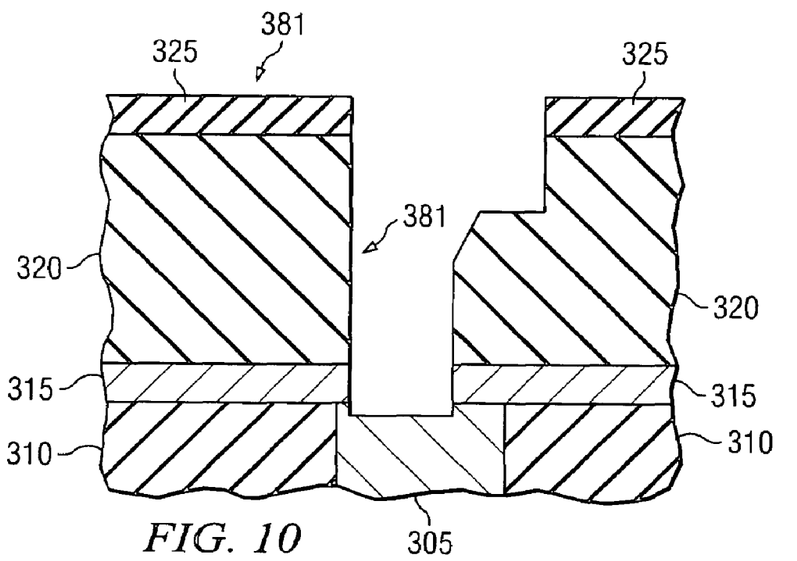

In FIG. 10, the aqueous DHF wash has been removed by a drying operation. No OPL or polymer residues remain as illustrated in FIG. 10 with the arrows 381, and a clean aperture down to the underlying metal trace 305 is illustrated.

Figure 11:
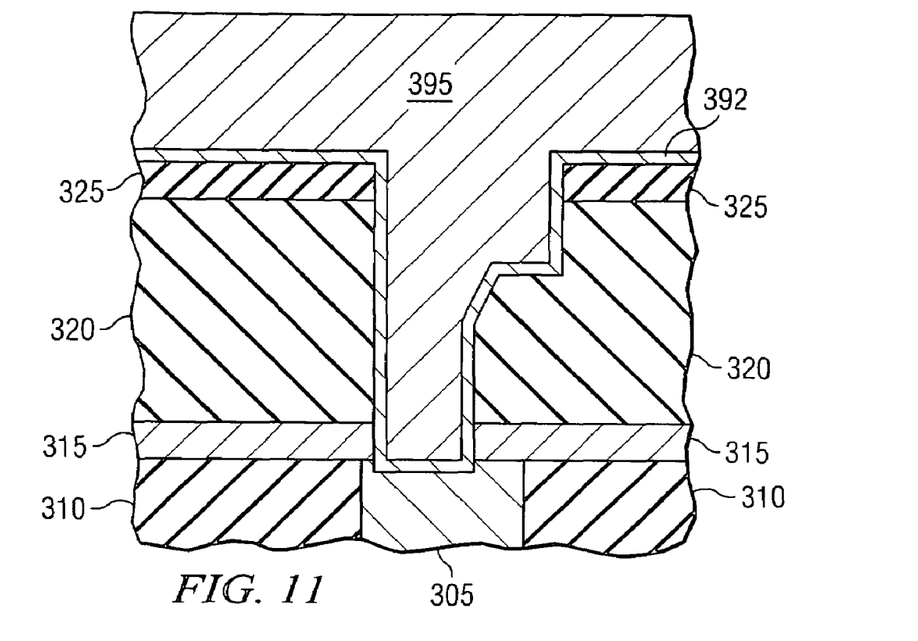
Figure 12:
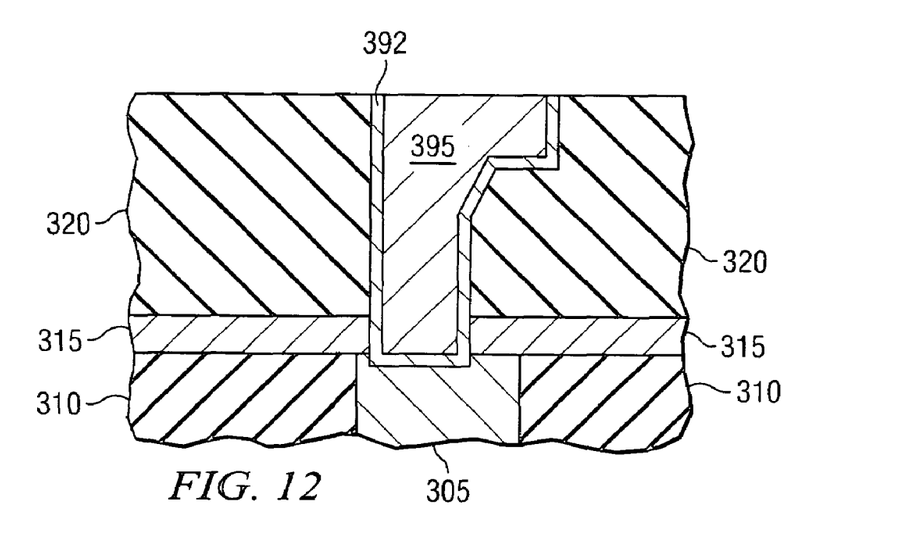

Turning now to FIG. 11, illustrated is the semiconductor wafer with a liner 392 preferably deposited in the via and in the trench to provide a diffusion barrier to prevent metal migration such as copper migration into the ILD. A diffusion barrier typically comprises a refractory metal or a compound thereof such as tantalum, titanium, tantalum nitride, titanium nitride, titanium tungsten, tungsten nitride, iridium, ruthenium, platinum or combinations thereof. In the preferred embodiment, a tantalum nitride layer is deposited by (ALD) atomic layer deposition to a thickness of between about 1 nm and 5 nm (preferably about 2 nm). Metal 395, preferably copper, is deposited in the via and in the trench. In a further preferred embodiment, a different metal such as tungsten or a combination of metals is deposited. In a preferred embodiment wherein copper is deposited, a copper seed layer is deposited first followed by electrodeposition of copper. In this embodiment, copper is deposited directly within the trench and via hole and in good electrical contact with the lower metal trace 305 through the liner 392. In another embodiment, the metal 395 can be electroplated directly onto the liner 392. The top surface of the wafer is polished with a chemical-mechanical polish (CMP), removing the hard mask layer 325, and exposing a substantially planar surface on the top of the wafer containing the metal trench and the ILD 320. The resulting polished, metal-filled via and trench 395 are shown in FIG. 12.

The semiconductor wafer is now ready for formation of further metallic interconnection layers if so desired by repeating the process described above, or for glassivation on a top layer of the wafer with etched apertures for contacts to the metallic layer below as is well known in the art. In this manner, a number of high-density interconnection layers can be formed on a semiconductor wafer to meet market needs for highly integrated devices produced with line widths that may be finer than 100 nm, that contain a large number of semiconductor circuit elements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor device, the method comprising:
   providing a wafer that includes a conductive region covered by a cap layer;
   depositing a dielectric layer over the conductive region, said dielectric layer extending from said cap layer at a lower surface to an upper surface and comprising the same material therethrough;
   etching a recess in the dielectric layer extending from said upper surface to said cap layer, the recess overlying the conductive region;
   depositing a sacrificial liner conformally over the dielectric layer subsequent to etching said recess, the conformal sacrificial liner being formed on the cap layer at the bottom of the recess and also formed on and extending from said upper surface to said lower surface along the sidewall of the recess, the sacrificial liner also being formed over said upper surface of the dielectric layer said liner having a constant thickness of between about 3 nm and 10 nm and being formed of a material removable by an aqueous wash that will not damage the conductive region;
   depositing an organic material over said sacrificial liner, said organic material filling said recess having said conformed sacrificial liner and forming a layer of said organic material over said sacrificial liner covering the upper surface of the said dielectric layer;
   planarizing said organic material, such that an organic planarization layer of said organic material remains over said sacrificial liner covering the upper surface of the dielectric layer including said recess;
   forming a trench structure within said organic planarization layer and transferring said trench structure from said planarization layer to said dielectric layer; and
   forming a dual damascene structure within the dielectric layer, the dual damascene structure including the recess, and the trench structure transferred from said organic planarization layer, wherein forming the dual damascene structure further comprises removing a portion of the planarization layer in said recess and a portion of the cap layer with a dry etch to expose the conductive region and depositing chemically altered portions of said planarized layers as residue onto said sacrificial liner on one of said sidewalls of the recess and said upper surface of the dielectric layer, the residue having a different chemical composition than said planarized layers, and then removing the sacrificial liner and any remaining chemically altered portions of said planarization layer that have been deposited as a residue onto said sacrificial liner on said sidewalls of the recess and said upper surface with said aqueous wash that will not damage said conductive region.

2. The method of claim 1 wherein the dielectric layer comprises a low-k dielectric material.

3. The method of claim 2 wherein the low-k dielectric material comprises SiCOH.

4. The method of claim 2 wherein the low-k dielectric material comprises a porous low-k dielectric material.

5. The method of claim 1 wherein the conductive region comprises a metallic conductive region.

6. The method of claim 5 wherein the material of the metallic conductive region comprises copper.

7. The method of claim 1 further comprising forming a hard mask layer over the dielectric layer before etching the recess in the dielectric layer.

8. The method of claim 7 wherein the hard mask layer comprises silicon nitride.

9. The method of claim 1 wherein the sacrificial liner comprises silicon dioxide.

10. The method of claim 1 wherein the conductive region is deposited in a second dielectric layer and wherein forming the dielectric layer comprises forming the dielectric layer over the second dielectric layer.

11. The method of claim 10 further comprising forming a cap layer between the dielectric layer and the second dielectric layer.

12. The method of claim 11 wherein the cap layer comprises a SiCN material.

13. The method of claim 10, the method further comprising:
   depositing a second liner as a diffusion barrier for metal over the wafer, the second liner being formed along sidewalls and the bottom of the damascene structure, the second liner also being formed over an upper surface of the wafer; and depositing a conductive material over the second liner, wherein the conductive material is separated from the dielectric layer and the second dielectric layer by the second liner.

14. The method of claim 13, wherein the dry plasma etch is a reactive-ion etch.

15. The method of claim 13 wherein the aqueous wash comprises dilute hydrofluoric acid.

16. The method of claim 13 wherein the second liner comprises tantalum nitride.

17. The method of claim 13 wherein depositing a conductive material comprises:
depositing a copper seed layer over the liner; and
electrodepositing copper over the copper seed layer.

18. The method of claim 13 wherein depositing a conductive material comprises electroplating copper onto the second liner.

19. The method of claim 13 further including chemical-mechanical polishing a top surface of the wafer to form a substantially planar surface after depositing the conductive material.

20. The method of claim 1, wherein the recess is a via hole.

21. The method of claim 1 wherein said liner is chemically vapor deposited (CVD).

22. The method of claim 1 wherein said dielectric layer comprised an uninterrupted layer of the same material therethrough.

23. The method of claim 1 wherein said aqueous wash is DHF (dilute hydrofluoric acid).

24. A method of fabricating a semiconductor device, the method comprising:
providing a wafer that includes a metallic conductive region, wherein the metallic conductive region is disposed in a lower dielectric layer;
depositing a cap layer over said metallic conductive region;
depositing an upper dielectric layer comprising a single material in contact with said cap layer, said dielectric layer extending between a lower surface and an upper surface and over the metallic conductive region and over the lower dielectric layer;
etching a via hole in the upper dielectric layer to said cap layer, the via hole overlying the metallic conductive region;
depositing a conformal sacrificial liner over the wafer subsequent to etching said via hole, the sacrificial liner comprising a material that can be removed by an aqueous that will not damage the conductive region being conformally formed along sidewalls and the cap layer at the bottom of the via hole, the sacrificial liner also being formed over an upper surface of the wafer;
depositing an organic planarization layer over the wafer and in the via hole having said conformal sacrificial liner on said sidewalls;
forming a trench structure in the planarization layer and transferring the trench structure from the organic planarization layer to the upper dielectric layer such that a dual damascene structure that includes the via hole is formed in the upper dielectric layer;
removing the planarization layer and the cap layer with a dry plasma to expose the conductive region and depositing a residue of said planarization layer that has been chemically altered on portions of said sacrificial liner;
removing the sacrificial liner with said aqueous wash that will not damage the said conductive region such that said chemically altered residue deposits of said planarization layer on said portions of said sacrificial liner are removed;
forming a second liner as a diffusion barrier for metal over the wafer, the second liner being formed along sidewalls and the bottom of both the trench structure and via hole of the dual damascene structure, the second liner also being formed over an upper surface of the wafer; and
depositing a conductive material over the second liner, wherein the conductive material is separated from the upper dielectric layer and the lower dielectric layer by the second liner.

25. The method of claim 24, wherein the upper dielectric layer is a low-k dielectric layer.

26. The method of claim 24, wherein the dual-damascene structure is formed by etching the planarization layer with a reactive-ion etch.

27. The method of claim 24 wherein the wet clean comprises dilute hydrofluoric acid.

28. The method of claim 24 wherein the second liner comprises tantalum nitride.

29. The method of claim 24 wherein depositing a conductive material comprises:
depositing a copper seed layer over the liner; and
electrodepositing copper over the copper seed layer.

30. The method of claim 24 wherein depositing a conductive material comprises electroplating copper onto the second liner.

31. The method of claim 24 further including chemical-mechanical polishing a top surface of the wafer to form a substantially planar surface after depositing the conductive material.

32. The method of claim 24 wherein said upper dielectric layer comprises an uninterrupted layer of said single material.

33. The method of claim 24 wherein said aqueous wash is DHF (dilute hydrofluoric acid).

34. A method of fabricating a semiconductor device, the method comprising:
providing a wafer that includes a copper conductive region, wherein the copper conductive region is disposed in a lower dielectric layer and is covered by a cap layer;
forming a low-k dielectric layer over the copper conductive region and in contact with the cap layer;
etching a via hole in the low-k dielectric layer down to the cap layer, the via hole overlying the copper conductive region;
depositing a sacrificial liner conformally over the wafer subsequent to etching said via hole, the conformal sacrificial liner completely covering the sidewalls and the bottom of the via hole, the sacrificial liner also being formed over an upper surface of the wafer and comprising a material that can be removed by an aqueous wash that will not damage the copper conductive region;
depositing an organic material over the wafer to completely fill the via hole and to form a planar layer over the upper surface of the wafer and the via hole;
forming a trench structure in the organic planar layer and transferring the trench structure from the organic planar layer to the low-k dielectric layer such that a dual damascene structure that includes the via hole is formed in the low-k dielectric layer;
removing the organic planar layer and a portion of the cap layer with a reactive-ion etch to expose the copper conductive region and depositing a residue of said planar layer that has been chemically altered on portions of said sacrificial liner;

removing the sacrificial liner with said aqueous wash that will not damage the conductive region such that said deposits of said planar layer on said portions of said planarization layer are removed;

depositing a second liner as a diffusion barrier for metal over the wafer, the second liner being formed along sidewalls and the bottom of the damascene structure, the second liner also being formed over an upper surface of the wafer;

depositing copper over the second liner, wherein the copper is separated from the low-k dielectric layer and the lower dielectric layer by the second liner; and performing a chemical-mechanical polish on a top surface of the wafer to form a substantially planar surface after depositing the copper.

35. The method of claim 34 wherein said low-k dielectric layer comprised an uninterrupted layer of said low-k dielectric.

36. The method of claim 34 wherein said aqueous wash is DHF (dilute hydrofluoric acid).

* * * * *